United States Patent [19]

Sharpe-Geisler

[11] Patent Number: 5,796,295
[45] Date of Patent: Aug. 18, 1998

[54] REFERENCE FOR CMOS MEMORY CELL HAVING PMOS AND NMOS TRANSISTORS WITH A COMMON FLOATING GATE

[75] Inventor: Bradley A. Sharpe-Geisler, San Jose, Calif.

[73] Assignee: Advanced Micro Devices, Inc., Sunnyvale, Calif.

[21] Appl. No.: 668,141

[22] Filed: Jun. 21, 1996

Related U.S. Application Data

[63] Continuation of Ser. No. 426,741, Apr. 21, 1995, abandoned.
[51] Int. Cl.$^6$ .................................. G05F 3/20; G11C 7/00
[52] U.S. Cl. ........................ 327/541; 327/543; 327/546; 365/149; 365/189.09
[58] Field of Search .......................... 365/149, 189.09; 327/538, 540, 541, 543, 545, 546

[56] References Cited

U.S. PATENT DOCUMENTS

| | | | |
|---|---|---|---|
| 4,843,258 | 6/1989 | Miyawaki et al. | 327/543 |
| 4,868,484 | 9/1989 | Seo et al. | 323/314 |
| 4,885,719 | 12/1989 | Brahmbhatt | 365/182 |
| 4,975,883 | 12/1990 | Baker et al. | 365/226 |
| 5,086,238 | 2/1992 | Watanabe et al. | |
| 5,272,368 | 12/1993 | Turnet et al. | 257/315 |
| 5,384,740 | 1/1995 | Etoh et al. | 365/189.09 |
| 5,394,359 | 2/1995 | Kowalski | 365/185 |
| 5,404,328 | 4/1995 | Takemae | 365/185 |
| 5,434,534 | 7/1995 | Lucas | 327/546 |

FOREIGN PATENT DOCUMENTS 0 431 911  12/1991  European Pat. Off. ......... G11C 16/04

OTHER PUBLICATIONS

"Stabilization of Voltage Limiter Circuit for High-Density DRAMs Using Miller Compensation". Hitoshi Tanaka. *Electronics and Communications in Japan*, Part 2, Apr. (1993).

*Primary Examiner*—Terry Cunningham
*Attorney, Agent, or Firm*—Fliesler, Dubb, Meyer & Lovejoy

[57] ABSTRACT

A voltage reference for a CMOS memory cell having PMOS and NMOS transistors with a common floating gate. The reference provides a more stable voltage than voltage supplied from the Vcc pin of a chip. In one embodiment, the reference includes PMOS and NMOS transistors having a common gate and common drains all connected together. A weak current source supplies current to the source of the PMOS transistor of the reference so that voltage at the source of the PMOS transistor of the reference equals the magnitude of the sum of threshold voltages (Vtn+Vtp) of the NMOS and PMOS transistors of the reference. The voltage at the source of the PMOS transistor of the reference is provided as a reference to the source of the PMOS transistor of the CMOS memory cell. The voltage at the drains of the PMOS and NMOS transistors of the reference are provided to a control gate of the CMOS memory cell. To assure zero power operation in subsequent cells following CMOS memory cells utilizing such a reference, cell implants are utilized in the CMOS memory cells and the reference to assure Vtn+Vtp is greater than or equal Vcc, and voltage to the reference is boosted above Vcc.

1 Claim, 3 Drawing Sheets

REFERENCE FOR CMOS MEMORY CELL HAVING PMOS AND NMOS TRANSISTORS WITH A COMMON FLOATING GATE

This application is a continuation of application Ser. No. 08/426,741, filed Apr. 21, 1995, now abandoned.

BACKGROUND OF THE INVENTION

1. Field of the Invention

The present invention relates to CMOS memory cells having PMOS and NMOS transistors with a common floating gate. More particularly, the present invention relates to a voltage reference for supplying voltage to such CMOS memory cells during read operations.

2. Description of the Related Art

FIG. 1 illustrates the configuration of a CMOS memory cell 100 having a PMOS transistor 102 and an NMOS transistor 104 with a common floating gate. Drains of transistors 102 and 104 are further connected together to form an output node 106. Bias voltage is provided to the common floating gate through capacitors 108 and 109 at nodes 118 and 119. Such a CMOS memory cell is disclosed in U.S. Pat. No. 5,272,368 entitled "Complementary Low Power Non-Volatile Reconfigurable EECELL," and in U.S. Pat. No. 4,885,719 entitled "Improved Logic Cell Array Using CMOS E²PROM Cells."

The CMOS memory cell 100 is typically included in an array of cells on an integrated circuit chip. Bias voltage is typically provided to the source of the PMOS transistors in the CMOS memory cells, such as transistor 102, from an external source through the chip's Vcc pin. The source of the NMOS transistors in the CMOS memory cells, such as transistor 104, are provided through the chip's ground or Vss pin.

The CMOS memory cell 100 is advantageous because it enables zero power operation, zero power operation indicating that a component does not continually draw power when the component is not changing states. For instance, with an appropriate voltage applied to the floating gate, transistor 102 will conduct and transistor 104 will not conduct. Current will then be provided from Vcc through transistor 102 to the output node 106 until the output node 106 is charged up to Vcc. In this configuration, no current will be provided through transistor 104 to Vss. Further, with another voltage applied to the floating gate, transistor 104 will conduct while transistor 102 does not. Node 106 will then discharge to Vss. No additional current will be provided through transistor 102 from Vcc to Vss.

Although the CMOS memory cell design of FIG. 1 enables zero power operation as described, the CMOS array cell 100 is not typically included in an array of memory cells on an integrated circuit chip. Instead a memory cell including a single NMOS transistor is utilized, such as the memory cell 200 of FIG. 2.

The memory cell 200 of FIG. 2 includes a single NMOS transistor 202 having a floating gate. Voltage is provided to the floating gate of transistor 202 through capacitors 208 and 209, similar to the manner voltage is provided to the common floating gate of transistors 102 and 104 in FIG. 1.

The memory cell 200 does not directly provide zero power operation as does the memory cell 100 shown in FIG. 1. For instance, with an appropriate charge applied to the floating gate of transistor 202 to enable it to conduct, transistor 202 will continuously conduct power from Vcc to Vss.

Including a PMOS transistor in a memory cell, as in the memory cell of FIG. 1, has previously not been considered practical for replacing the design of FIG. 2 because the threshold of the PMOS transistor is referenced to Vcc rather than to Vss as with an NMOS transistor. Note that threshold voltage is the gate to source voltage enabling a transistor to turn on. With variations in Vcc, which typically occur, voltage on the floating gate of a CMOS cell must be varied to assure its PMOS transistor is turned off.

To illustrate, Table I shows the state of NMOS and PMOS transistors with varied floating gate (F.G.) voltages, as listed. In Table I, Vcc is varied from 3.0V to 4.0V. Further, the magnitude of the threshold voltage (Vtp) for the PMOS transistor 102 is 1.5V, and the magnitude of the threshold voltage (Vtn) for the NMOS transistor 104 is 1.5V.

TABLE I

| (Vcc = 3.0V, Vtp = 1.5V, Vtn = 1.5V) | | | | | |
| --- | --- | --- | --- | --- | --- |
| F. G.= 0.5 | 1.5 | 2.5 | | | |
| n-chan.   off | off | on | | | |
| p-chan.   on | off | off | | | |
| (Vcc = 4.0V, Vtp = 1.5V, Vtn = 1.5V) | | | | | |
| F. G.= 0.5 | 1.5 | 2.0 | 2.5 | 3.0 | 3.5 |
| n-chan.   off | off | on | on | on | on |
| p-chan.   on | on | on | off | off | off |

As illustrated by Table I, if Vcc is set at 3.0V, when Vcc spikes to 4.0V, to turn off the PMOS transistor, the floating gate voltage must be raised from 1.5V to approximately 2.5V. Current limitations in the ability to store charge on the floating gate of a transistor prevent manufacturers from storing sufficient charge to enable the PMOS transistor to be turned off during Vcc voltage spikes. Thus, the design of FIG. 2 is not currently considered practical.

With increasing popularity of battery powered electronic devices, such as notebook computers, it is desirable to have zero power components which do not continually drain battery power during operation. Thus, it is desirable to utilize memory cells with the CMOS configuration shown in FIG. 1, which is capable of providing zero power operation, as opposed to the memory cell design of FIG. 2.

SUMMARY OF THE INVENTION

The present invention enables CMOS memory cells to be utilized on an integrated circuit chip to provide zero power operation by providing a source voltage to the PMOS transistors of the memory cells, the voltage remaining stable with variations in Vcc.

The present invention further provides voltages to the CMOS memory cells during read to enable a minimum amount of charge to be added or removed from floating gates to turn the cells on or off.

The present invention is a reference for providing a more stable voltage to the source of the PMOS transistor than Vcc.

In an embodiment of the present invention, a voltage reference is configured to enable a minimum amount of charge to be added or removed from a floating gate to turn a CMOS cell on or off. The voltage reference includes a PMOS transistor and an NMOS transistor with a common gate. The reference is provided on a single integrated circuit with the CMOS memory cells to which the reference supplies voltage. The common gate of the PMOS and NMOS transistors of the reference are coupled to their drains. The source of the NMOS transistor of the reference is connected to Vss.

The reference further includes a weak current source coupled to supply current to the source of the PMOS transistor of the reference. The weak current source enables the PMOS and NMOS transistors to barely turn on so that the voltage at the drain of the NMOS transistor is substantially equal to the magnitude of the threshold of the NMOS transistor (Vtn) and the voltage at the source of the PMOS transistor is substantially equal to the magnitude of the threshold of the PMOS transistor (Vtp) plus Vtn.

To provide a reference voltage, the source of the PMOS transistor of the reference is coupled to the source of each PMOS transistor of the CMOS memory cells. Because the thresholds of PMOS and NMOS transistors of the CMOS memory cells remain constant on a single integrated circuit, the voltage provided by the reference to the source of the PMOS transistors of each CMOS memory cell will be substantially equal to the sum of the magnitude of the thresholds of its PMOS transistor and NMOS transistor.

A reference voltage is further provided from the drain of the NMOS transistor of the reference to the gate of one or more capacitors to which the floating gate voltage of each CMOS memory cell is referenced.

With such reference voltages applied to a CMOS memory cell, with zero volts on the floating gate of the CMOS memory cell, both the PMOS and NMOS transistors of the CMOS memory cell will be barely on as with the reference. However, with any charge added to the floating gate, the NMOS transistor will turn on and the PMOS transistor will turn off. Further, with any charge removed from the floating gate, the NMOS transistor will turn off and the PMOS transistor will turn on. Thus, a minimum amount of adding or subtracting charge from the floating gate is necessary to change states of the CMOS memory cell.

With a reference applying Vtn+Vtp to the source of the PMOS transistor of a CMOS memory cell, and with Vtn+Vtp less than Vcc, an additional CMOS circuit stage connected to the CMOS memory cell output which has Vcc applied to the source of its PMOS transistor will continually burn power. To assure zero power operation throughout an integrated circuit containing CMOS memory cells with such a reference, the present invention utilizes cell implants in the PMOS and NMOS transistors of the CMOS memory cells and the reference to assure Vtn+Vtp is equal to or greater than Vcc. Additionally, to assure the sources of the PMOS transistors of the CMOS memory cells maintain a value equal to or greater than Vcc, voltage applied to the source of the PMOS transistor of the reference is boosted above Vcc.

BRIEF DESCRIPTION OF THE DRAWINGS

Further details of the present invention are explained with the help of the attached drawings in which.

DETAILED DESCRIPTION

Figure 1:
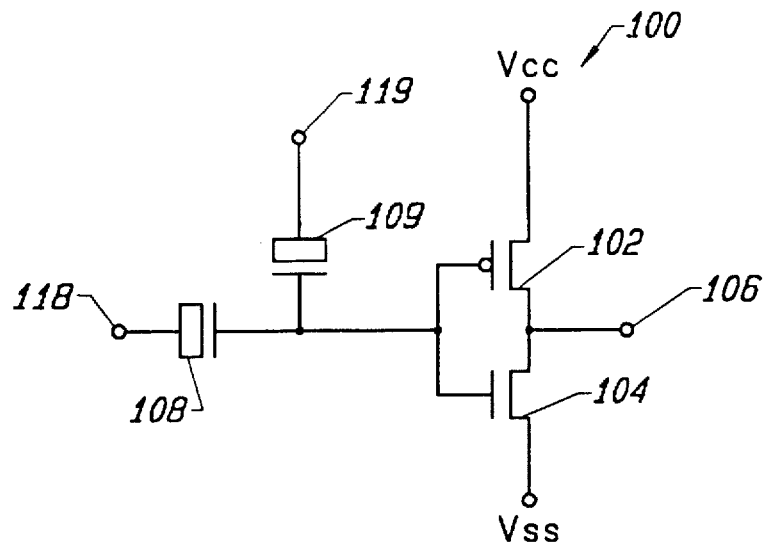
FIG. 1 illustrates the configuration of a CMOS memory cell having a PMOS transistor and an NMOS transistor with a common floating gate.
Figure 2:
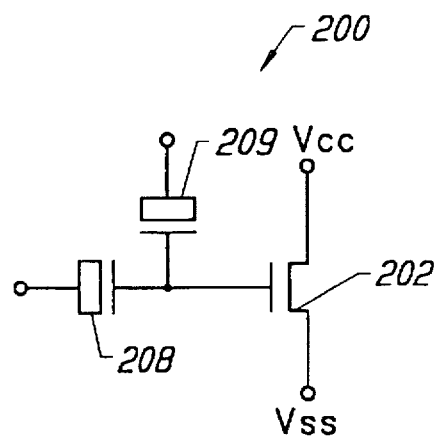
FIG. 2 shows a conventional memory cell configuration including a single NMOS transistor with a floating gate.
Figure 3:
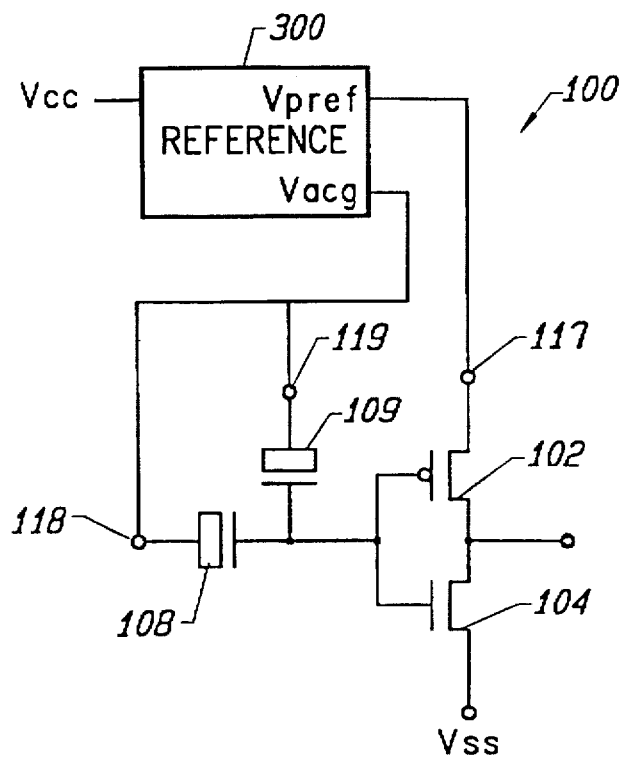
FIG. 3 illustrates the configuration of the present invention which includes a reference connected to a CMOS memory cell as shown in FIG. 1.

FIG. 3 illustrates the configuration of the present invention which includes a reference 300 connected to a CMOS memory cell 100 as shown in FIG. 1. As shown, voltage reference 300 receives a supply voltage from the Vcc pin of a chip and provides a more stabilized voltage to a CMOS memory cell 100 during read operations. One output, Vpref, of the reference 300 is supplied to the source of the PMOS transistor 102 of the CMOS memory cell 100 at node 117. A second output, Vacg, of the reference 300 of FIG. 3 may also be provided as an array control gate reference to one or both capacitors 108 and 109 through nodes 118 and 119.

During program and erase modes, switches (not shown) at nodes 117, 118, and 119 disconnect reference 300 and connect a separate power supply (not shown) at nodes 117, 118 and 119. The power supply connected during program and erase includes a voltage pump and operates to apply voltages to enable adding or subtracting charge to/from the floating gate of the CMOS memory cell 100, similar to voltages applied during program and erase as described in U.S. Pat. No. 5,272,368, previously referenced.

During read mode, nodes 117, 118 and 119 are connected to reference 300 and the Vacg and Vpref voltage output from reference 300 is applied enabling less charge to be provided to the floating gate of the CMOS memory cell than during a conventional read process to assure the memory cell remains in a particular state. Conventionally during read, a voltage Vcc/2 is supplied to the gate of capacitors 108 and 109 as disclosed in U.S. Pat. No. 5,272,368, previously referenced. Voltage on the floating gate of cell 100 is determined with reference to voltage on the inputs 118 and 119 to capacitors 108 and 109, as well as to the voltage on the sources of the NMOS and PMOS transistors. With Vcc/2 applied to the inputs 118 and 119 of capacitors 108 and 109 during read, during variations in Vcc, the floating gate voltage value will vary as Vcc changes, dictating that a greater range of charge must be added or removed from the floating gate to assure that transistors in the CMOS cell remains either on or off. By stabilizing the Vcc voltage value through reference 300 before the voltage is supplied to capacitors 108 and 109, the range of charge which must be added or removed from the floating gate can be reduced.

Figure 4:
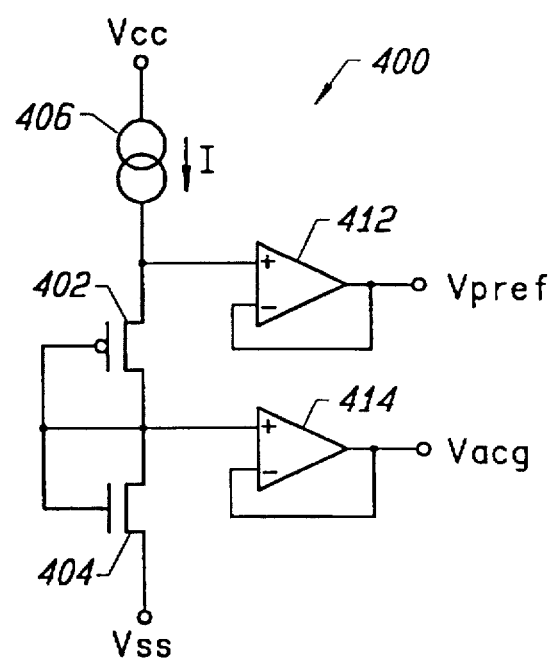
FIG. 4 shows an embodiment of the reference of the present invention.

FIG. 4 shows an embodiment of the reference of the present invention. The voltage reference includes a PMOS transistor 402 and an NMOS transistor 404 with a common gate. The common gate of the PMOS transistor 402 and NMOS transistor 404 of the reference is coupled to the drain of NMOS transistor 404. Drains of transistors 402 and 404 are further coupled together. The source of the NMOS transistor of the reference is connected to Vss.

The reference further includes a weak current source 406 coupled to supply current to the source of the PMOS transistor 402. The weak current source 406 supplies a low current, for example 0.1 μamps, to enable the PMOS transistor 402 and NMOS transistor 404 to barely turn on. With transistors 402 and 404 barely on, voltage at the drain of the NMOS transistor 404 is substantially equal to the magnitude of the threshold (Vtn) of the NMOS transistor 404 and the voltage at the source of the PMOS transistor 402 is substantially equal to the magnitude of the threshold (Vtp) of the PMOS transistor 402 plus Vtn.

To provide the reference voltage output Vpref of FIG. 3, the source of the PMOS transistor 402 of the reference 400 is coupled to the source of each PMOS transistor of the CMOS memory cells. Because a large number of memory cells may provide a capacitive load adversely affecting the voltage at the source of the PMOS transistor 402, a voltage follower buffer 412 can be provided to couple the source of transistor 402 to the source of PMOS transistors of the CMOS memory cells.

A reference voltage is further coupled from the drain of the NMOS transistor 404 to provide the Vacg reference output of FIG. 3 to inputs of capacitors connected to the floating gates of CMOS memory cells. Because a large number of memory cells may provide a capacitive load adversely affecting the voltage at the source of the NMOS transistor 404, a voltage follower buffer 414 can be provided to couple the drain of transistor 404 to capacitors of the CMOS memory cells.

Transistors 402 and 404 are provided on a single integrated circuit with the CMOS memory cells to which the voltage reference supplies bias voltage. Because the thresholds of PMOS and NMOS transistors remain constant on a single integrated circuit, the voltage provided from the source of PMOS transistor 402 will be substantially equal to the sum of the thresholds of any similarly configured PMOS transistor and NMOS transistor on the same integrated circuit. Further, the voltage provided from the drain of NMOS transistor 404 will be substantially equal to the threshold of any similarly configured NMOS transistor on the same integrated circuit.

Thus, with a reference configured as shown in FIG. 4 connected to CMOS memory cells in an array as shown in FIG. 3, a minimum amount of charge must be added or removed from floating gates of CMOS cells to turn the cells on or off. For example, with zero volts on the floating gate of a CMOS memory cell in the array, both its PMOS and NMOS transistors will be barely on as with the reference. However, with any charge added to the floating gate of the CMOS memory cell, its NMOS transistor will turn on and its PMOS transistor will turn off. Further, with any charge subtracted from the floating gate of the CMOS memory cell, its NMOS transistor will turn off and its PMOS transistor will turn on. Thus, a minimum amount of charge must be added or subtracted to the floating gate to change states of the CMOS memory cell.

Utilizing the reference of FIG. 4 to apply a voltage to the source of all CMOS memory cells equal to Vtn+Vtp, with Vtn+Vtp less than Vcc, an additional CMOS circuit stage connected to the CMOS memory cell output which has Vcc applied to the source of its PMOS transistor will continually burn power.

To assure zero power operation throughout an integrated circuit containing CMOS memory cells utilizing the reference of FIG. 4, the present invention first utilizes cell implants in the PMOS and NMOS transistors of the reference and the CMOS memory cells on the integrated circuit. The cell implants constitute additional ion implantation in the channel between the source and drain of the PMOS and NMOS transistors. The cell implants are added to an extent to assure Vtn+Vtp of the PMOS and NMOS transistors is equal to or greater than Vcc.

Figure 5:
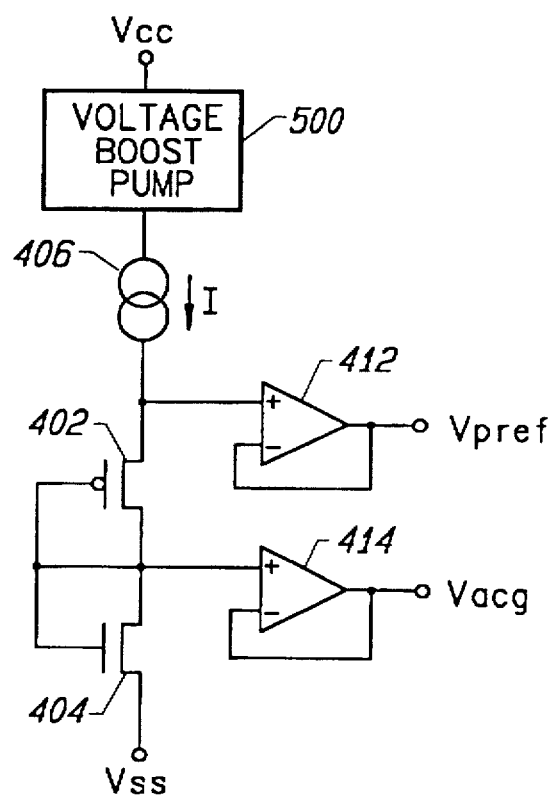
FIG. 5 shows an the reference of FIG. 4 with voltage boosted above Vcc to assure zero power operation.

Additionally, to assure zero power operation, as shown in FIG. 5, a voltage boost pump 500 is added to the circuitry of FIG. 4 to boost voltage above Vcc which is supplied to the source of the PMOS transistor of the reference. With the output of the CMOS memory cells providing a voltage range equal to or greater than Vcc, no current leakage will occur in subsequent CMOS stages enabling zero power operation throughout an integrated circuit.

Although the invention has been described above with particularity, this was merely to teach one of ordinary skill in the art how to make and use the invention. Many modifications will fall within the scope of the invention, as that scope is defined by the claims which follow.

What is claimed is:

1. An integrated circuit comprising:

a voltage reference circuit having a PMOS transistor and an NMOS transistor having drains connected in common and having a common gate connected to the common drains;

a memory cell having a PMOS transistor and an NMOS transistor with a common floating gate, a source of the PMOS transistor of the memory cell being coupled to a source of the PMOS transistor of the reference circuit; and a voltage boost pump for receiving a voltage (Vcc) from a voltage supply pin and providing a boosted voltage higher than the voltage (Vcc) to a source of the PMOS transistor of the reference circuit, wherein the PMOS and NMOS transistors of the reference circuit include cell implants so that a sum of magnitudes of thresholds of the PMOS and NMOS transistors of the reference circuit are equal to or greater than the voltage (Vcc) from the voltage supply pin.

* * * * *